United States Patent
Campbell et al.

(10) Patent No.: US 7,355,905 B2
(45) Date of Patent: Apr. 8, 2008

(54) INTEGRATED CIRCUIT WITH SEPARATE SUPPLY VOLTAGE FOR MEMORY THAT IS DIFFERENT FROM LOGIC CIRCUIT SUPPLY VOLTAGE

(75) Inventors: Brian J. Campbell, Sunnyvale, CA (US); Vincent R. von Kaenel, Palo Alto, CA (US); Daniel C. Murray, Morgan Hill, CA (US); Gregory S. Scott, Santa Clara, CA (US); Sribalan Santhanam, Palo Alto, CA (US)

(73) Assignee: P.A. Semi, Inc., Santa Clara, CA (US)

( * ) Notice: Subject to any disclaimer, the term of this patent is extended or adjusted under 35 U.S.C. 154(b) by 307 days.

(21) Appl. No.: 11/173,565

(22) Filed: Jul. 1, 2005

(65) Prior Publication Data

US 2007/0002636 A1    Jan. 4, 2007

(51) Int. Cl.
*G11C 7/00* (2006.01)

(52) U.S. Cl. ............................ 365/189.11; 365/189.08; 365/189.12

(58) Field of Classification Search ........... 365/189.04, 365/189.03, 189.08, 189.11, 189.12
See application file for complete search history.

(56) References Cited

U.S. PATENT DOCUMENTS

| | | | |
|---|---|---|---|
| 4,879,690 A | 11/1989 | Anami et al. | |
| 5,450,365 A | 9/1995 | Adachi | |
| 6,501,306 B1 | 12/2002 | Kim et al. | |
| 6,920,060 B2* | 7/2005 | Chow et al. | 365/145 |
| 7,000,214 B2 | 2/2006 | Iadanza et al. | |
| 7,019,559 B2 | 3/2006 | Kouzuma | |
| 7,098,692 B2 | 8/2006 | Joshi et al. | |
| 7,120,061 B2* | 10/2006 | Daga | 365/185.23 |
| 7,245,532 B2* | 7/2007 | Jyouno et al. | 365/185.08 |
| 2001/0008491 A1 | 7/2001 | Yoshihiko | |

OTHER PUBLICATIONS

International Search Report and Written Opinion for PCT/US2006/026096, mailed Nov. 23, 2006, 11 pages.
P.A. Semi, "The PWRficient Processor Family," Jan. 2006, pp. 1-31.
U.S. Appl. No. 11/160,236, filed Dec. 13, 2006.

* cited by examiner

*Primary Examiner*—Son Dinh
*Assistant Examiner*—Hien Nguyen
(74) *Attorney, Agent, or Firm*—Lawrence J. Merkel; Meyertons, Hood, Kivlin, Kowert & Goetzel, P.C.

(57) ABSTRACT

In one embodiment, an integrated circuit comprises at least one logic circuit supplied by a first supply voltage and at least one memory circuit coupled to the logic circuit and supplied by a second supply voltage. The memory circuit is configured to be read and written responsive to the logic circuit even if the first supply voltage is less than the second supply voltage during use. In another embodiment, a method comprises a logic circuit reading a memory cell, the logic circuit supplied by a first supply voltage; and the memory cell responding to the read using signals that are referenced to the first supply voltage, wherein the memory cell is supplied with a second supply voltage that is greater than the first supply voltage during use.

18 Claims, 4 Drawing Sheets

INTEGRATED CIRCUIT WITH SEPARATE SUPPLY VOLTAGE FOR MEMORY THAT IS DIFFERENT FROM LOGIC CIRCUIT SUPPLY VOLTAGE

BACKGROUND

1. Field of the Invention

This invention is related to the field of integrated circuits including integrated memories such as static random access memory (SRAM) and, more particularly, to supplying power to such integrated circuits.

2. Description of the Related Art

As the number of transistors included on a single integrated circuit "chip" has increased and as the operating frequency of the integrated circuits has increased, the management of power consumed by an integrated circuit has continued to increase in importance. If power consumption is not managed, meeting the thermal requirements of the integrated circuit (e.g. providing components required to adequately cool the integrated circuit during operation to remain within thermal limits of the integrated circuit) may be overly costly or even infeasible. Additionally, in some applications such as battery powered devices, managing power consumption in an integrated circuit may be key to providing acceptable battery life.

Power consumption in an integrated circuit is related to the supply voltage provided to the integrated circuit. For example, many digital logic circuits represent a binary one and a binary zero as the supply voltage and ground voltage, respectively (or vice versa). As digital logic evaluates during operation, signals frequently transition fully from one voltage to the other. Thus, the power consumed in an integrated circuit is dependent on the magnitude of the supply voltage relative to the ground voltage. Reducing the supply voltage generally leads to reduced power consumption. However, there are limits to the amount by which the supply voltage may be reduced.

One limit to the reduction of supply voltage that is experienced in integrated circuits that integrate memories (such as SRAM) is related to the robustness of the memory. As supply voltage decreases below a certain voltage, the ability to reliably read and write the memory decreases. The reduced reliability may have several sources. The resistances of some devices in the memory (e.g. the pass gate transistors that couple bit lines to memory cells in an SRAM) may change as the supply voltage falls. The changed resistance may impact the ability to overdrive the memory cell for a write or to discharge the bit line for a read. Additionally, in some designs, the transistors in the memory are high threshold voltage (high $V_T$) transistors. That is, the threshold voltage at which the transistors activate (or "turn on" ... i.e. actively conduct current) is higher than other transistors in the integrated circuit. The threshold voltage of such transistors does not scale well with supply voltage. Accordingly, the "trip point" (the point at which a write to a memory cell occurs) as a percentage of the supply voltage worsens as the supply voltage is decreased. As an example, in one current integrated circuit manufacturing process, a supply voltage below about 0.9 volts results in reduced ability to write the memory reliably. Similarly, the ability to quickly and/or reliably read the memory decreases. Accordingly, the supply voltage at which the robustness of the memory begins to be impacted has served as a floor to reducing the supply voltage to an integrated circuit that includes memory.

SUMMARY

In one embodiment, an integrated circuit comprises at least one logic circuit supplied by a first supply voltage and at least one memory circuit coupled to the logic circuit and supplied by a second supply voltage. The memory circuit is configured to be read and written responsive to the logic circuit even if the first supply voltage is less than the second supply voltage during use.

In another embodiment, a method comprises a logic circuit reading a memory cell, the logic circuit supplied by a first supply voltage; and the memory cell responding to the read using signals that are referenced to the first supply voltage, wherein the memory cell is supplied with a second supply voltage that is greater than the first supply voltage during use.

BRIEF DESCRIPTION OF THE DRAWINGS

The following detailed description makes reference to the accompanying drawings, which are now briefly described.

Figure 1:
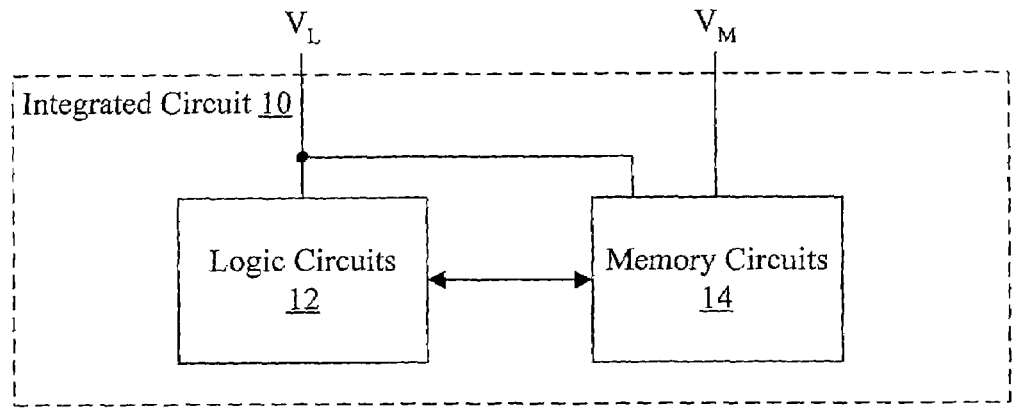
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Turning now to FIG. 1, a block diagram of one embodiment of an integrated circuit 10 is shown. In the illustrated embodiment, the integrated circuit includes a plurality of logic circuits 12 and a plurality of memory circuits 14. The logic circuits 12 are coupled to the memory circuits 14. The logic circuits 12 are powered by a first supply voltage provided to the integrated circuit 10 (labeled $V_L$ in FIG. 1). The memory circuits 14 are powered by a second power supply voltage provided to the integrated circuit 10 (labeled $V_M$ in FIG. 1). In the illustrated embodiment, the memory circuits 14 are also powered by the $V_L$ supply voltage, as will be explained in more detail for certain embodiments below. The integrated circuit 10 may generally comprise the logic circuits 12 and the memory circuits 14 integrated onto a single semiconductor substrate (or chip).

The logic circuits 12 may generally implement the operation for which the integrated circuit is designed. The logic circuits 12 may generate various values during operation, which the logic circuits 12 may store in the memory circuits 14. Additionally, the logic circuits 12 may read various values from the memory circuits 14 on which to operate. For example, in various embodiments, the memory circuits 14 may include memory used for caches, register files, integrated-circuit-specific data structures, etc. The memory circuits 14 may implement any type of readable/writeable memory. In an example below, an SRAM memory will be used. It is noted that, while the illustrated embodiment includes a plurality of logic circuits 12 and a plurality of memory circuits 14, various embodiments may include at least one logic circuit 12 and at least one memory circuit 14.

Generally, if a logic circuit 12 is to access a memory circuit 14, the logic circuit 12 may generate various control signals to the memory circuit 14. For example, the control signals may include an address identifying the memory location in the memory circuit 14 that is to be accessed, a read enable signal which may be asserted to perform a read, and a write enable signal which may be asserted to perform a write. For a read, the memory circuit 14 may output data to the logic circuit 12. For a write, the logic circuit 12 may supply data to the memory circuit 14 for storage.

By separating the supply voltage for the logic circuits 12 and the memory circuits 14, the supply voltage for the logic circuits 12 ($V_L$) may be reduced below the level at which the memory circuits 14 may operate robustly. The supply voltage for the memory circuits 14 ($V_M$) may be maintained at the minimum supply voltage that provides for robust memory operation (or greater, if desired). Thus, the $V_L$ supply voltage may be less than the $V_M$ supply voltage during use. At other times, the $V_L$ supply voltage may exceed the $V_M$ supply voltage during use (e.g. at times when higher performance is desired and higher power consumption is acceptable to achieve the higher performance). Alternatively, the $V_M$ supply voltage may be increased to match the $V_L$ Supply voltage if the $V_L$ supply voltage would otherwise exceed the $V_M$ supply voltage.

Generally, a supply voltage may be a voltage provided to a circuit to power the circuit, providing the electrical energy to permit the circuit to generate one or more outputs responsive to one or more inputs. At various points herein, supply voltages may be referred to as being greater than or less than other supply voltages. That is, the magnitude of the voltage may be greater than (or less than) the magnitude of the other voltage.

Figure 2:
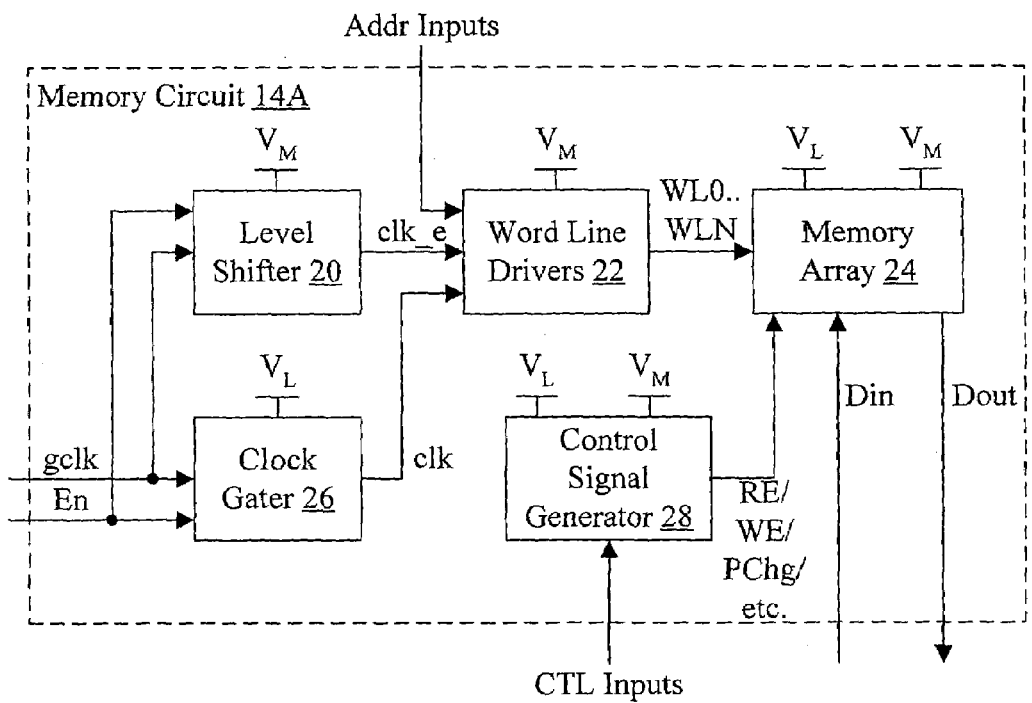
FIG. 2 is a block diagram of one embodiment of a memory circuit shown in FIG. 1.

Turning now to FIG. 2, a block diagram of one embodiment of a memory circuit 14A is shown. The memory circuit 14A may be one of the memory circuits 14. Other memory circuits 14 may be similar. In the embodiment of FIG. 2, the memory circuit 14A includes a level shifter circuit 20, a set of word line driver circuits 22, a memory array 24, a clock gater circuit 26, and a control signal generator circuit 28. The level shifter 20 and the word line drivers 22 are supplied by the $V_M$ supply voltage. The memory array 24 and the control signal generator 28 are supplied by both the $V_M$ and the $V_L$ supply voltages. The clock gater 26 is supplied by the $V_L$ supply voltage. The level shifter 20 and the clock gater 26 are coupled to receive a clock input (gclk) and one or more enable inputs (En) from the logic circuits 12. The clock gater 26 is configured to generate a clock output (clk) to the word line drivers 22 and the level shifter 20 is also configured to generate a clock output (clk_e) to the word line drivers 22. The word line drivers 22 are further coupled to receive one or more address inputs (Addr inputs) from the logic circuits 12. The word line drivers 22 are configured to generate a set of word lines to the memory array 24 (WL0 . . . WLN). The memory array 24 is further coupled to receive data (Din) and provide data (Dout) to/from the logic circuits 12. Additionally, the memory array 24 is coupled to receive various control signals from the control signal generator 28. For example, the control signals may include a write enable (WE) signal and a read enable (RE) signal. The control signal may also include a precharge (PChg) signal, and any other desired control signals. The control signal generator 28 may generate the control signals for the memory array 24 from corresponding control inputs from the logic circuits 12, and may level shift control signals, in some embodiments.

The memory array 24 may comprise a plurality of memory cells that are supplied by the $V_M$ supply voltage. However, the memory circuit 14A is designed to provide for access to the memory array 24 by the logic circuits 12, even if the logic circuits 12 are supplied with a $V_L$ supply voltage that is less than the $V_M$ supply voltage. Each memory cell is activated for access (read or write) by one of the word lines WL0 . . . WLN coupled to that memory cell. One or more memory cells coupled to the same word line form a "word" for access in the memory array 24. That is, the bits of the word may be read/written as a group. The width of the word may thus be the width of the Din and Dout signals from the memory array 24.

Since the memory cells are supplied by the $V_M$ supply voltage, the word lines may also be supplied by the $V_M$ supply voltage. That is, when a word line is asserted high, the word line may be at approximately a $V_M$ voltage. Thus, the word line drivers 22 are supplied with the $V_M$ supply voltage.

The word line drivers 22 activate a given word line based on address inputs from the logic circuits 12. The address identifies the word in the memory array 24 to be accessed for a given access generated by the logic circuits 12. In some embodiments, the logic circuits 12 may include circuits that partially or fully decode the address, and the address inputs may be the partially or fully decoded address. Alternatively, the word line drivers 22 may implement the full decode function and the address inputs may encode the address. Generally, each different address causes a different word line WL0 to WLN to be asserted.

Since the word line drivers 22 are supplied with the $V_M$ supply voltage, inputs to the word line drivers 22 that are coupled to the gates of p-type metal oxide semiconductor (PMOS) transistors in the word line drivers 22 may be driven to a $V_M$ voltage when driven high (to ensure that the PMOS transistors, which are supplied with a $V_M$ supply voltage, are fully turned off when the gate is driven high). That is, if the gate of the PMOS transistor is driven to a voltage less than the $V_M$ supply voltage on its source, the gate to source voltage of the PMOS transistor is still negative and thus the PMOS transistor may still be active even though it is logically intended to be inactive. If the word line drivers 22 were designed with static complementary MOS (CMOS) circuits, each input would be coupled to the gate of a PMOS transistor and would be driven to a $V_M$ voltage when driven high. In one embodiment, the word line drivers 22 may be implemented with dynamic logic gates. Thus, the clock signal that precharges the circuit (clk_e) is coupled to the gate of a PMOS transistor and may be driven to a $V_M$ voltage. Other signals, coupled to the gates of n-type MOS (NMOS) transistors, may be driven with the $V_L$ voltage. Thus, the address inputs from the logic circuits 12 may be provided directly to the word line drivers 22 (without level shifting). Additionally, the clk signal from the clock gater 26 (supplied with the $V_L$ voltage and thus driven to the $V_L$ voltage when driven high) may be provided directly to the word line drivers 22.

The level shifter 20 is configured to generate the clk_e signal responsive to the gclk signal and the En signal. If the En signal (or signals) indicate that the clock is enabled for the current clock cycle, the level shifter 20 may generate the clk_e signal by level shifting the gclk signal such that the high assertion of the clk_e signal is at a $V_M$ voltage. If the En signal (or signals) indicate that the clock is disabled, the level shifter 20 may hold the clk_e signal steady at a low level (ground). In other implementations, the level shifter 20 may hold the clk_e signal steady at a high level ($V_M$) if the En signal (or signals) indicate that the clock is disabled. The gclk signal, provided from the logic circuits 12, may be at a $V_L$ voltage when asserted high.

Generally, a level shifter circuit may be a circuit configured to level shift an input signal to produce an output signal. Level shifting a signal may refer to changing the high assertion of the signal from one voltage to another. Level shifting may be performed in either direction (e.g. the voltage after level shifting may be higher or lower than the voltage before level shifting). In some embodiments, the low assertion may remain the ground voltage supplied to the integrated circuit 10 (not shown in the figures, often referred to as $V_{SS}$). A signal that is driven to a high assertion equal to a given supply voltage may be referred to as in the "domain" of that supply voltage or "referenced to" that supply voltage.

While the present embodiment provides enable signals and the level shifter 20 has a clock gating function in addition to a level shifting function, other embodiments may not include the enable signals and may unconditionally generate the output signal from the input signals. Furthermore, in other embodiments, a level shifter 20 that does not integrate the enable/disable function may be used with a clock gater similar to clock gater 26. The output of a clock gater may be level shifted by such a level shifter, for example. Furthermore, a level shifter 20 that does not implement the enable/disable function may be used without a clock gater 26 (e.g. for control signal generation in the control signal generator 28). Additionally, other embodiments may employ other constructions of the word line drivers 22 and additional signals input to the word line drivers 22 may be level shifted.

The clock gater 26 generates the clk signal responsive to the En signal (or signals) and the gclk signal (similar to the discussion above for the level shifter). If the En signal (or signals) indicate that the clock is enabled for the current clock cycle, the clock gater 26 may generate the clk signal responsive to the gclk signal. If the En signal (or signals) indicate that the clock is disabled, the clock gater 26 may hold the clk signal steady at a low level (ground). In other implementations, the clock gater 26 may hold the clk signal steady at a high level ($V_L$) if the En signal (or signals) indicate that the clock is disabled. In other embodiments, the clock gater 26 may be eliminated and the clk_e signal may be used in place of the clk signal in the word line drivers 22.

In some embodiments, the delay through the level shifter 20 may be approximately the same as the delay through the clock gater 26. In such embodiments, the impact of the level shifter 20 on the critical timing path of the integrated circuit 10 (if any) may be minimized.

As mentioned above, the memory circuit 14A is designed to provide read/write access to the memory array 24 even if the $V_M$ supply voltage is higher than the $V_L$ supply voltage. The level shifter 20 level-shifting input signals and the word line drivers 22 operating at the $V_M$ voltage provide the start of an access. The Din and Dout signals provide the data in (for a write) or the data out (for a read), and thus are in the $V_L$ domain used by the logic circuits 12 in this embodiment. The memory array 24 may also be supplied with the $V_L$ voltage, and may be configured to operate with the Din and Dout signals in the $V_L$ domain. In other embodiments, the Din and Dout signals may be level shifted between the $V_L$ and $V_M$ domains, or only the Din signals may be level shifted and the Dout signals may be in the VM domain.

In one embodiment, at least the sense amplifier (senseamp) circuits in the memory array 24 that sense the bits read from the memory cells are supplied with the $V_L$ voltage. Thus, the senseamps may also provide a level shift to the $V_L$ domain for the Dout signals. In another embodiment, the senseamp circuits may be supplied with the $V_M$ voltage and the Dout signals may be in the $V_M$ domain. In another implementation, the bit lines coupled to the memory cells to communicate the bits into and out of the memory cells may be in the $V_L$ domain and thus other circuitry that is coupled to the bit lines may be supplied with the $V_L$ supply voltage (except for the memory cells themselves).

As mentioned previously, signals in the $V_L$ domain that are coupled to the gates of PMOS transistors that are supplied by the $V_M$ supply voltage may be level shifted. Thus, in various embodiments, some of the control signals provided to the memory array 24 may be level-shifted. The control signal generator 28 may provide the level shifting, as needed, in various embodiments. If a given control signal is not level shifted, the control signal generator 28 may generate the control signal using circuitry supplied by the $V_L$ supply voltage. If a given control signal is level shifted, the control signal generator 28 may include a level shifter to shift to the $V_M$ domain.

Figure 3:
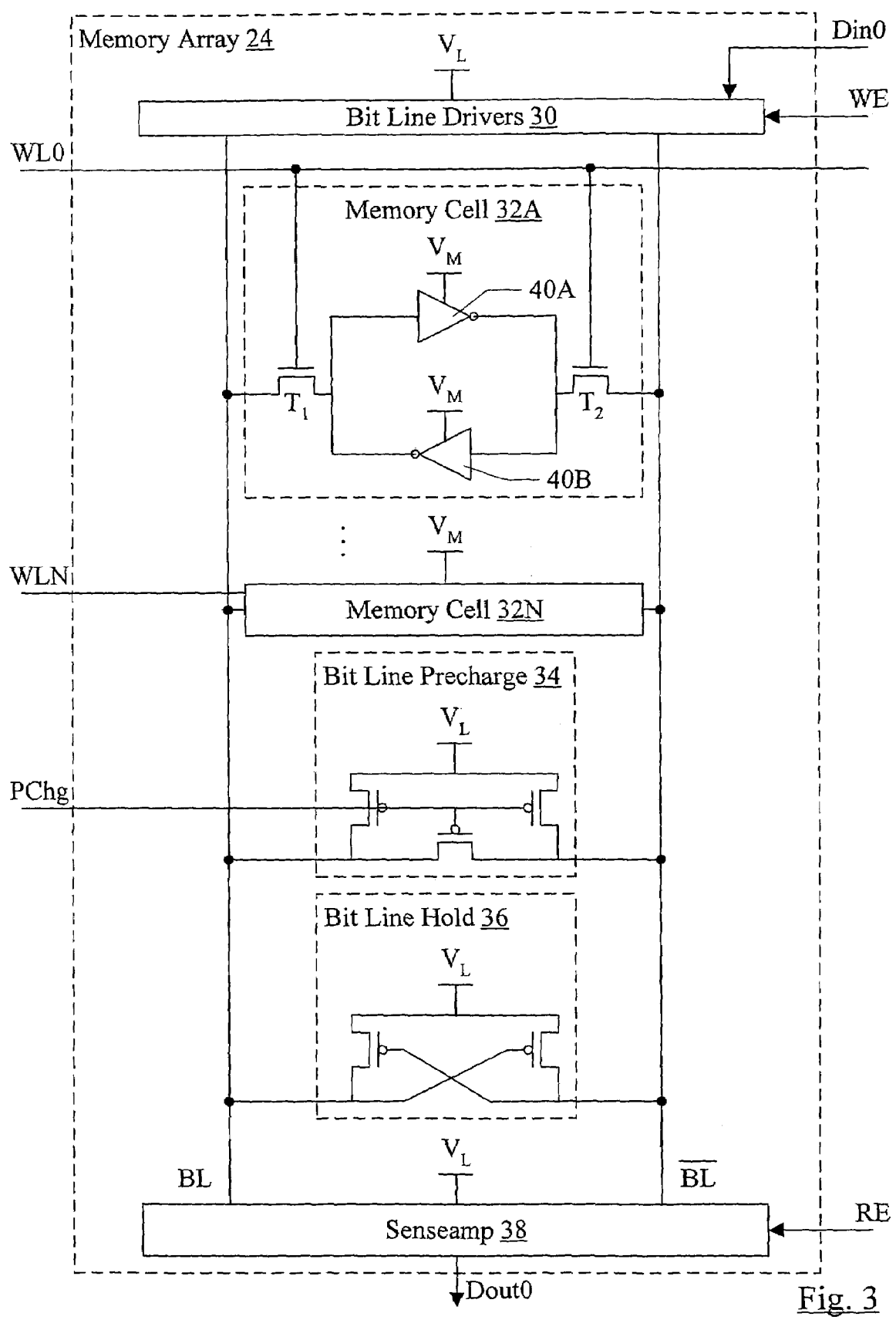
FIG. 3 is a circuit diagram of one embodiment of a memory array shown in FIG. 2.

Turning now to FIG. 3, a circuit diagram of a portion of one embodiment of the memory array 24 is shown. The portion shown in FIG. 3 may correspond to bit 0 of the Din and Dout signals (shown as Din0 and Dout0, respectively, in FIG. 3). Other portions similar to the portion shown in FIG. 3 may be implemented for other bits in the Din/Dout word. In the embodiment of FIG. 3, the memory array 24 includes bit line driver circuits 30, memory cells 32A-32N, a bit line precharge circuit 34, a bit line hold circuit 36, and a senseamp 38. The memory cells 32A-32N are supplied with the $V_M$ supply voltage. The bit line drivers 30, the bit line precharge circuit 34, the bit line hold circuit 36, and the senseamp 38 are supplied by the $V_L$ supply voltage. The bit line drivers 30, the memory cells 32A-32N, the bit line precharge circuit 34, the bit line hold circuit 36, and the senseamp 38 are coupled to a pair of bit lines (BL and BL bar, the latter labeled as BL with a bar over it in FIG. 3). The memory cell 32A is coupled to word line WL0, and the memory cell 32N is coupled to the word line WLN. Other memory cells, not explicitly shown in FIG. 3 but indicated by the ellipses between the memory cells 32A and 32N, are coupled to other word lines. The bit line precharge circuit 34 is coupled to a precharge input signal (PChg in FIG. 3) that is in the $V_L$ domain in the present embodiment. The bit line drivers 30 are coupled to receive the Din0 signal and the write enable (WE) signal. The senseamp 38 is coupled to the Dout0 signal and the read enable (RE) signal.

The memory cell 32A is shown in more detail in FIG. 3, and the other memory cells such as memory cell 32N may be similar. The memory cell 32A in FIG. 3 includes a typical CMOS SRAM cell comprising cross-coupled inverters 40A-40B coupled to the bit lines through NMOS transistors $T_1$ and $T_2$. In some embodiments, the transistors in the memory cells 32A-32N may be high $V_T$ transistors. The gates of the transistors $T_1$ and $T_2$ are coupled to the word line WL0. Accordingly, when the word line WL0 is asserted high, the transistors $T_1$ and $T_2$ provide a conductive path between the inverters 40A-40B and the bit lines. Since the word lines are in the $V_M$ domain, the transistors $T_1$ and $T_2$ may have a resistance, when activated, as designed for the memory array 24. The resistance is related to the gate to source voltage of the transistors $T_1$ and $T_2$. The resistance of the transistors $T_1$ and $T_2$, as compared to transistors in the inverters 40A-40B which are also powered with the $V_M$ voltage, may scale with the $V_M$ voltage.

Generally, the bit lines may be used to transfer a bit into and out of a memory cell 32A-32N that is activated using the corresponding word line. The bit lines represent the bit differentially, with BL being the true value of the bit and BL bar being the complement of the bit.

To perform a write operation, the bit line drivers 30 may be activated by asserting the WE signal. The bit line drivers 30 drive the Din0 bit on the BL line, and the complement of the Din0 bit on the BL bar line. The write of the memory cell 32A-32N may primarily be accomplished by the bit line that is driven low, and thus driving the bit lines in the $V_L$ domain may be sufficient to reliably write the memory cell. For example, if the memory cell 32A is currently storing a binary 1 and is being written to a zero, the bit line drivers 30 drive the BL line low and the BL bar line to $V_L$. The PMOS transistor in the inverter 40B is attempting to hold the output of the inverter 40B at a logical one ($V_M$ voltage). The bit line drivers 30 are designed to overdrive the transistors in the inverters 40A-40B, and thus the output of the inverter 40B (input of the inverter 40A) is driven toward zero. The output of the inverter 40A switches to a binary one as well, disabling the PMOS transistor in the inverter 40B and completing the flip of the memory cell 32A. Thus, in the illustrated embodiment, the WE signal and the Din0 signal may not be level shifted to the $V_M$ domain.

In other embodiments, the bit lines may be in the $V_M$ domain. The bit line drivers 30 may be dynamic, or may receive level-shifted Din0 and WE signals in such embodiments. The bit line drivers 30 may further be supplied by the $V_M$ supply voltage in such embodiments.

For read operations, the bit lines may be precharged prior to activating a memory cell 32A-32N via a corresponding word line. The activated memory cell 32A-32N discharges one of the bit lines based on the stored value of the memory cell, and the senseamp 38 detects the differential between the bit lines and amplifies the differential to produce the output bit Dout0. Since a differential is being sensed, as long as the bit lines are balanced at about the same voltage prior to the start of the read, the correct value may be read. Accordingly, operating the bit lines in the $V_L$ domain may also be sufficient for read operations. In other embodiments, if the bit lines are in the $V_M$ domain (e.g. if the bit line precharge circuit 34 and the bit line hold circuit 36 are supplied with the $V_M$ supply voltage), the senseamp 38 may provide the level shifting of the signals back to the Dout0 signal in the $V_L$ domain. In still other embodiments, the Dout0 signal may be in the $V_M$ domain and the senseamp 38 may also be powered by the $V_M$ supply voltage.

The senseamp 38 may comprise any sense amplifier circuit that is coupled to receive a pair of bit lines and sense a differential between the pair to drive an output bit. In other embodiments, the senseamp 38 may output a differential pair of bits with full signal swing, amplified from the sensed differential on the bit lines. For example, a differential of about 100 millivolts on the bit lines may be sufficient for the senseamp 38 to detect the difference. The senseamp 38 in the illustrated embodiment is controlled by the RE signal. In the illustrated embodiment, the RE signal is not level shifted to the $V_M$ domain. In other embodiments in which the senseamp 38 is supplied with the $V_M$ voltage, the RE signal may be level shifted to the $V_M$ domain if it is coupled to one or more PMOS transistors in the senseamp 38 that are also coupled to the $V_M$ supply voltage.

The bit line precharge circuit 34 is supplied by the $V_L$ supply voltage, and may precharge the bit lines responsive to the assertion (low) of the PChg signal to prepare the bit lines for a read. In the illustrated embodiment, the bit line precharge circuit 34 may comprise PMOS transistors having their gates coupled to the precharge signal. The PMOS transistors shown vertically in FIG. 3 may precharge the bit lines, and the horizontal PMOS transistor may provide balancing of the voltage on the bit lines. In other embodiments, two bit line precharge circuits may be used. One bit line precharge circuit may be used if the previous operation was a read, since the bit lines are not fully discharged in a read operation. Both precharge circuits may be used if the previous operation was a write, to precharge the bit line that was fully (or almost fully) discharged to a voltage near ground. As mentioned previously, in other embodiments the bit line precharge circuit 34 may be supplied by the $V_M$ supply voltage and the PChg signal may be level shifted to the $V_M$ domain in such embodiments.

The bit line hold circuit 36 may be provided to hold the precharge on one of the bit lines during a read or write operation responsive to the other bit line falling. As mentioned previously, in other embodiments the bit line hold circuit 36 may be supplied by the $V_M$ supply voltage.

While specific examples of the bit line precharge circuit 34 and the bit line hold circuit 36 are illustrated in FIG. 3, any designs for the bit line precharge circuit 34 and/or the bit line hold circuit 36 may be used in other embodiments.

While the memory cell 32A is shown as a CMOS SRAM cell, other memory cells may be used in other embodiments. Generally, a memory cell may comprise circuitry configured to store a bit and configured to permit reading and writing of the bit.

Figure 4:
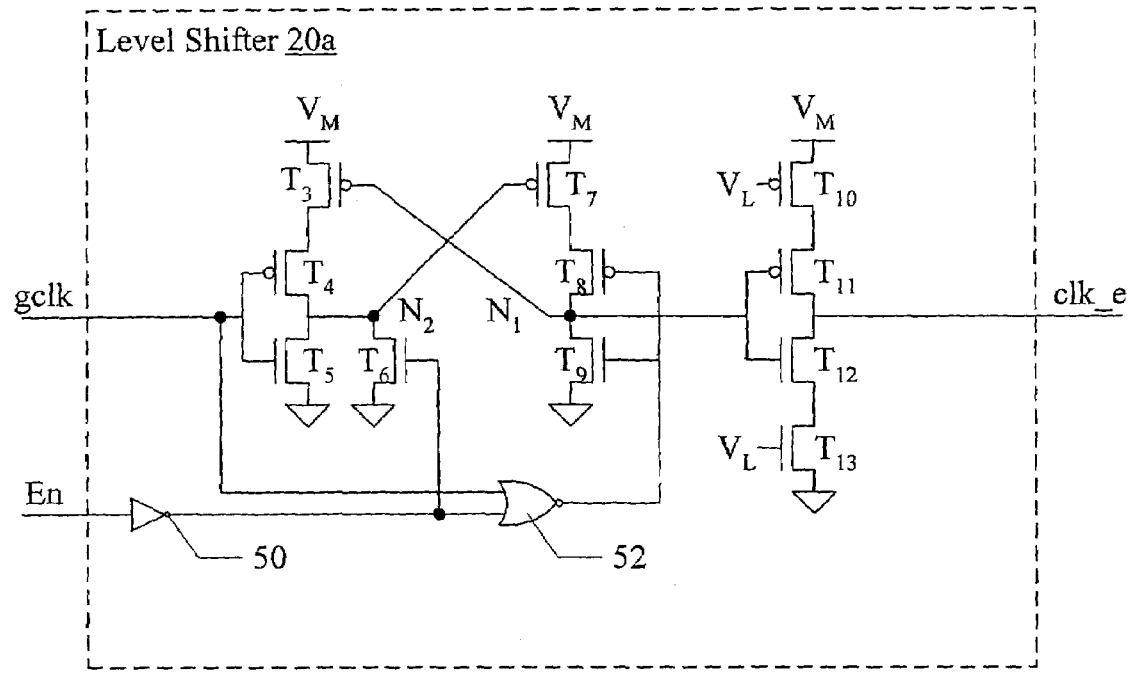
FIG. 4 is a circuit diagram of one embodiment of a level shifter shown in FIG. 2.

Turning now to FIG. 4, a circuit diagram of one embodiment 20a of the level shifter 20 is shown. In the embodiment of FIG. 4, the level shifter 20a includes a shifting stage comprising transistors $T_3$-$T_9$ and an output inverter comprising transistors $T_{10}$-$T_{13}$. $T_3$ has a source coupled to the $V_M$ supply voltage, a gate coupled to a node N1, and a drain coupled to the source of $T_4$. The gates of $T_4$ and $T_5$ are coupled to the gclk signal, and the drains of $T_4$, $T_5$, and $T_6$ are coupled to the node N2. The sources of $T_5$ and $T_6$ are coupled to ground. The gate of $T_6$ is coupled to an inversion of the En signal, output from the inverter 50. The output of the inverter 50 and the gclk signal are inputs to a NOR gate 52, which has its output coupled to the gates of $T_8$ and $T_9$. The source of $T_9$ is coupled to ground. The drains of $T_8$ and $T_9$ are coupled to the node N1. The source of $T_8$ is coupled to the drain of $T_7$, which has its source coupled to the $V_M$ supply voltage. The gate of the transistor $T_7$ is coupled to the node N2. The node N1 is the output of the shift stage and supplies the input to the output inverter. The gates of $T_{11}$ and $T_{12}$ are coupled to the node N1, and the drains of $T_{11}$ and $T_{12}$ are coupled to the clk_e signal. The source of $T_{11}$ is coupled to the drain of $T_{10}$, which has its source coupled to the $V_M$ supply voltage and its gate coupled to the $V_L$ supply voltage. The source of $T_{12}$ is coupled to the drain of $T_{13}$, which has its source coupled to ground. The gate of $T_{13}$ is coupled to the $V_L$ supply voltage.

Operation of the shift stage will first be described. For simplicity, the En signal will be assumed asserted to indicate enabled (and thus $T_6$ is disabled and the NOR gate 52 passes the inversion of the gclk signal). When gclk transitions from low to high, $T_5$ is activated and begins discharging node N2. $T_4$ is also deactivated by the gclk transition, isolating the node N2 from $T_3$. As the node N2 discharges, $T_7$ activates and begins charging node N1 to the $V_M$ supply voltage ($T_8$ is also activated, and $T_9$ is deactivated, by the transition to low on the output of the NOR gate 52 due to the transition high of the gclk signal). Accordingly, N1 results in the same logical state as the gclk signal, at the $V_M$ supply voltage. When gclk transitions from high to low, the output of the NOR gate transitions from low to high and $T_9$ is activated. $T_9$ begins discharging the node N1. $T_8$ is also deactivated by the gclk transition, isolating the node N1 from $T_7$. Thus, the node N1 is discharged to ground. As the node N1 discharges, $T_3$ activates and begins charging node N2 to the $V_M$ supply voltage ($T_4$ is also activated by the transition to low of gclk), thus deactivating $T_7$.

$T_4$ and $T_8$ may limit power dissipation during transition, by isolating the nodes N2 and N1, respectively, from $T_3$ and $T_7$, respectively. $T_3$ and $T_7$ may be delayed in deactivating with respect to the activation of $T_5$ and $T_9$, respectively, since $T_3$ and $T_7$ are deactivated through the charging of nodes N1 and N2, respectively. By isolating $T_3$ and $T_7$ from their respective nodes N2 and N1 when $T_5$ and $T_9$ are activated, $T_3$ and $T_7$ may be prevented from fighting the discharge of their respective nodes N2 and N1. $T_4$ and $T_8$ are optional and may be deleted in other embodiments. In such embodiments, the drains of $T_3$ and $T_7$ may be coupled to the drains of $T_5$ and $T_9$, respectively.

In this embodiment, the level shifter 20a also provides clock gating functionality via the enable signal. If the enable signal is deasserted (low), $T_6$ is activated via the output of the inverter 50 and $T_8$ is activated via the output of the NOR gate 52. $T_6$ discharges node N2 (which activates $T_7$). $T_7$ and $T_8$ in series charge node N1. $T_3$ is deactivated as the node N1 is charged. Thus, the output node N1 may be held steady at the $V_M$ supply voltage if the enable signal is deasserted, independent of the state of the gclk signal. In other embodiments, the level shifter 20a may not implement clock gating. In such embodiments, $T_6$ and the inverter 50 may be eliminated, and the NOR gate 52 may be replaced by an inverter having the gclk signal as an input.

The output inverter provides output buffering, which may permit the transistors $T_3$-$T_9$ to be smaller. The output inverter is optional and may be eliminated in other embodiments. $T_{11}$ and $T_{12}$ provide the inversion. In the illustrated embodiment, the transistors $T_{10}$ and $T_{13}$ are provided to aid in matching the delay of the level shifter 20a to the clock gater 26. These transistors are optional and may be eliminated in other embodiments. In such embodiments, the source of $T_{11}$ may be coupled to the $V_M$ supply voltage and the source of $T_{12}$ may be coupled to ground. Alternatively, only $T_{10}$ may be eliminated in other embodiments.

The embodiment of FIG. 4 provides an inversion of the gclk to the clk_e signals. That is, the gclk and clk_e signals may be approximately 180 degrees out of phase (where the delay through the level shifter 20a may account for the signals being somewhat less than 180 degrees out of phase). The embodiment of FIG. 5 is an example of a second embodiment of the level shifter 20 (level shifter 20b) that provides a clk_e approximately in phase with the gclk signal (but lagging due to the delay of the level shifter 20b).

Figure 5:
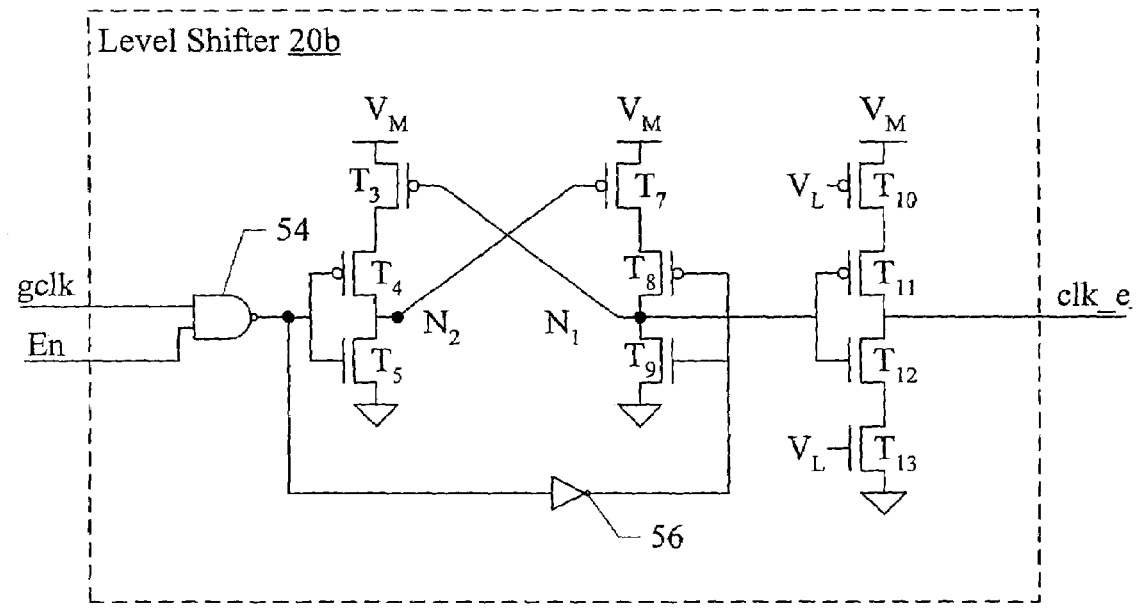
FIG. 5 is a circuit diagram of another embodiment of a level shifter shown in FIG. 2.

The embodiment of FIG. 5 includes a shift stage comprising $T_3$-$T_5$ and $T_7$-$T_9$ and an output inverter comprising $T_{10}$-$T_{13}$. $T_3$-$T_5$, $T_7$-$T_9$, and $T_{10}$-$T_{13}$ are coupled to each other and to the nodes N1 and N2 in a manner similar to the embodiment of FIG. 4. $T_3$-$T_5$, $T_7$-$T_9$, and $T_{10}$-$T_{13}$ operate similar to the description of FIG. 4 responsive to the high and low inputs on their gate terminals. Comments regarding portions that are optional may be similar to the description of FIG. 4 as well. However, the gates of $T_4$ and $T_5$ are coupled to receive an inversion of the gclk signal, instead of the gclk signal, when the En signal is asserted (through a NAND gate 54). The output of the NAND gate 54 is inverted via the inverter 56, the output of which is coupled to the gates of $T_8$ and $T_9$. Accordingly, the node N1 transitions low if the gclk signal transitions high and the node N1 transitions high if the gclk transitions low. The output clk_e is the inversion of the node N1, and thus is approximately in phase with the gclk signal (lagging by the delay of the level shifter 20b). If the enable signal is deasserted, the output of the NAND gate 54 is high and the output of the inverter 56 is low, thus holding the node N1 steady at the $V_M$ supply voltage (and the clk_e at the ground voltage) independent of the gclk signal. Embodiments of the level shifter 20b that do not implement clock gating may replace the NAND gate 54 with an inverter (or may eliminate the NAND gate 54 and may couple the node N2 to the output inverter stage).

Figure 6:
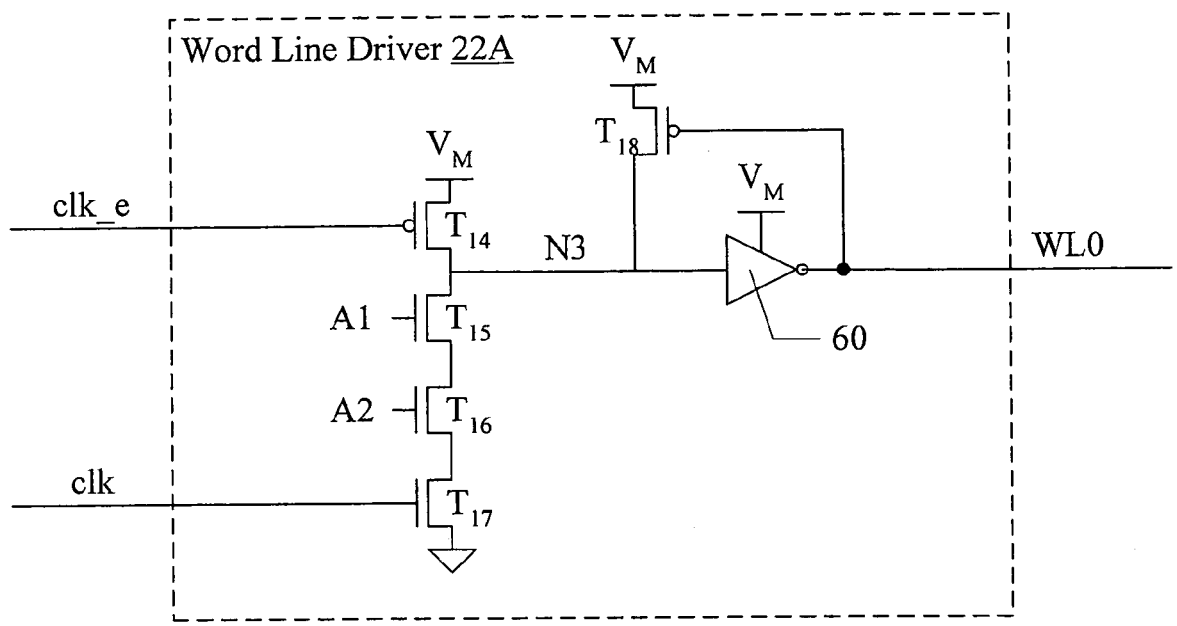
FIG. 6 is a circuit diagram of one embodiment of a word line driver shown in FIG. 2.

FIG. 6 is a circuit diagram of one embodiment of a word line driver 22A, which may be one of the word line drivers 22. Other word line drivers 22 may be similar. The word line driver 22A generates the WL0 word line in this embodiment. The word line driver 22A illustrates one embodiment of a dynamic circuit for driving the word line WL0. In the illustrated embodiment, the word line driver 22A includes transistors $T_{14}$-$T_{18}$ and an inverter 60 supplied by the $V_M$ supply voltage. $T_{14}$ has a source coupled to the $V_M$ supply voltage, a gate coupled to the clk_e clock signal from the level shifter 20, and a drain coupled to the node N3. $T_{15}$-$T_{17}$ are coupled in series, with $T_{15}$ having its drain coupled to the node N3 and $T_{17}$ having its source coupled to ground. The gates of $T_{15}$ and $T_{16}$ are coupled to receive address inputs A1 and A2, and the gate of $T_{17}$ is coupled to the clk clock signal from the clock gater 26. The input of the inverter 60 and the drain of $T_{18}$ are coupled to the node N3. The output of the inverter 60 is the word line WL0, and is also coupled to the gate of $T_{18}$, which has its source coupled to the $V_M$ supply voltage.

The word line driver 22A is a dynamic NAND gate in this embodiment. Thus, $T_{14}$ precharges the node N3 in response to a deassertion of clk_e, and is deactivated in response to an assertion of clk_e. Since clk_e has been level shifted to the $V_M$ domain, the assertion of clk_e is to the $V_M$ voltage and thus T14 may be fully deactivated while clk_e is asserted.

While clk_e is asserted, clk may be asserted to cause an evaluation of the dynamic NAND gate. If both of the A1 and A2 inputs are asserted, the transistors $T_{15}$-$T_{17}$ discharge the node N3 and the word line WL0 is asserted (driven to the $V_M$ supply voltage by the inverter 60). If one or both of A1 and A2 inputs are deasserted, the node N3 is not discharged and the word line WL0 is not asserted. $T_{18}$ may serve as a keeper if the node N3 is not discharged, preventing the node N3 from floating.

Since the clk clock signal and the inputs A1-A2 are not coupled to PMOS transistors (and thus do not require $V_M$ voltage level to ensure that a PMOS is deactivated when the PMOS's source is coupled to the $V_M$ supply voltage), the clk clock signal and the A1-A2 inputs may be in the $V_L$ domain.

While a two input dynamic NAND gate is shown in the embodiment of FIG. 6, any logic function on any number of inputs may be implemented in other embodiments.

Figure 7:
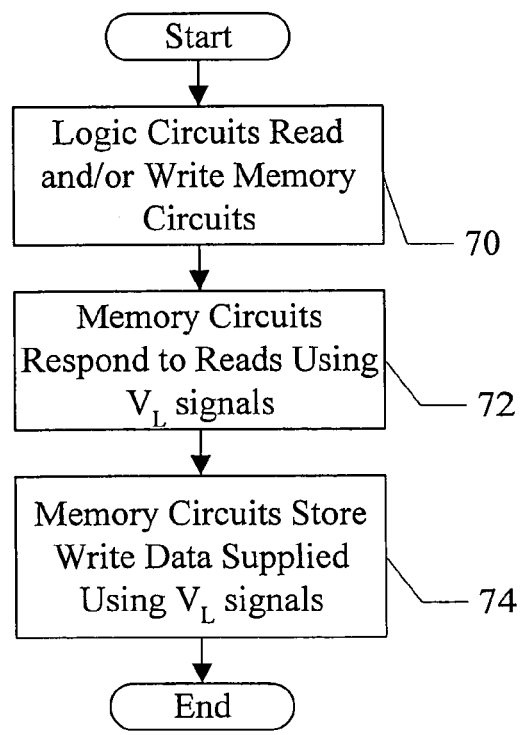
FIG. 7 is a flowchart illustrating one embodiment of a method.

Turning now to FIG. 7, a flowchart illustrating one embodiment of a method is shown. The logic circuits 12 may read and/or write the memory circuits 14 (block 70). The memory circuits 14 may respond to reads using $V_L$ signals (that is, signals in the $V_L$ domain or referenced to $V_L$—block 72). The memory circuits may store write data provided using $V_L$ signals (block 74).

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   at least one logic circuit supplied by a first supply voltage received on a first input to the integrated circuit; and
   at least one memory circuit coupled to the logic circuit and supplied by a second supply voltage received on a second input to the integrated circuit, and wherein the memory circuit is configured to be read and written responsive to the logic circuit even if the first supply voltage is less than the second supply voltage during use, and wherein the memory circuit comprises at least one memory array, and wherein the memory array comprises a plurality of memory cells that are continuously supplied by the second supply voltage during use.

2. The integrated circuit as recited in claim 1 wherein the memory circuit is supplied by the first supply voltage in addition to the second supply voltage.

3. The integrated circuit as recited in claim 1 wherein the memory circuit comprises a word line driver circuit supplied by the second supply voltage, wherein a first memory cell of the plurality of memory cells is coupled to receive a word line from the word line driver circuit to activate the first memory cell for access.

4. The integrated circuit as recited in claim 3 wherein the memory circuit further comprises a level shifter circuit supplied with the second supply voltage, wherein the level shifter circuit is coupled to receive an input signal from the logic circuit and to level shift the input signal to the second supply voltage from the first supply voltage, and wherein the level shifter circuit is coupled to provide the level-shifted signal to the word line driver circuit.

5. The integrated circuit as recited in claim 4 wherein the input signal comprises a clock signal, and wherein the word line driver circuit comprises a dynamic logic circuit, and wherein the clock signal triggers a precharge of the dynamic logic circuit.

6. The integrated circuit as recited in claim 5 wherein the word line driver circuit is further coupled to receive one or more additional input signals that are not level shifted.

7. The integrated circuit as recited in claim 4 wherein the level shifter circuit comprises an output inverter comprising a series connection of two n-type metal oxide semiconductor (NMOS) transistors, wherein a gate of a first of the NMOS transistors is coupled to receive the level-shifted signal, and wherein a gate of a second of the NMOS transistors is coupled to the first supply voltage.

8. The integrated circuit as recited in claim 7 wherein the output inverter further comprises a series connection of two p-type metal oxide semiconductor (PMOS) transistors, wherein a gate of a first of the PMOS transistors is coupled to receive the level-shifted signal, and wherein a gate of a second of the PMOS transistors is coupled to the first supply voltage, and wherein a source of the second of the PMOS transistors is coupled to the second supply voltage.

9. The integrated circuit as recited in claim 3 wherein the first memory cell is coupled to a pair of bit lines, and wherein the memory circuit comprises a bit line driver circuit coupled to the pair of bit lines and configured to drive the pair of bit lines to write the first memory cell, and wherein the bit line driver circuit is supplied with the first supply voltage.

10. The integrated circuit as recited in claim 3 wherein the first memory cell is coupled to a pair of bit lines, and wherein the memory circuit comprises a sense amplifier circuit coupled to the pair of bit lines and configured to sense a value of the first memory cell for output in response to a read, and wherein the sense amplifier circuit is supplied with the first supply voltage.

11. The integrated circuit as recited in claim 10 wherein the memory circuit further comprises a bit line precharge circuit configured to precharge the pair of bit lines to prepare for the read, and wherein the bit line precharge circuit is supplied by the first supply voltage.

12. The integrated circuit as recited in claim 11 wherein the memory circuit further comprises a bit line hold circuit configured to hold the precharge on the pair of bit lines during periods of inactivity, and wherein the bit line hold circuit is supplied by the first supply voltage.

13. A method comprising:
    a logic circuit reading a memory cell, the logic circuit supplied by a first supply voltage received on a first input to the integrated circuit; and
    the memory cell responding to the read using signals that are referenced to the first supply voltage, wherein the memory cell is supplied with a second supply voltage that is greater than the first supply voltage during use; and wherein the second supply voltage is received on a second input to the integrated circuit, and wherein the memory circuit comprises at least one memory array, and wherein the memory array comprises a plurality of memory cells that are continuously supplied by the second supply voltage during use.

14. The method as recited in claim 13 further comprising:
    the logic circuit writing the memory cell using signals that are referenced to the first supply voltage; and
    the memory cell storing the write data from the logic circuit.

15. An integrated circuit comprising:
    at least one logic circuit supplied by a first supply voltage; and
    at least one memory circuit coupled to the logic circuit and supplied by a second supply voltage, and wherein the memory circuit is configured to be read and written responsive to the logic circuit even if the first supply voltage is less than the second supply voltage during use, and wherein the memory circuit comprises a first memory cell supplied by the second supply voltage and a word line driver circuit supplied by the second supply voltage, wherein the first memory cell is coupled to receive a word line from the word line driver circuit to select the first memory cell for access, and wherein the memory circuit further comprises a level shifter circuit supplied with the second supply voltage, wherein the level shifter circuit is coupled to receive a clock signal from the logic circuit and to level shift the clock signal to the second supply voltage from the first supply voltage, and wherein the level shifter circuit is coupled to provide the level-shifted clock signal to the word line driver circuit, and wherein the word line driver circuit comprises a dynamic logic circuit, and wherein the clock signal triggers a precharge of the dynamic logic circuit.

16. The integrated circuit as recited in claim 15 wherein the word line driver circuit is further coupled to receive one or more additional input signals that are not level shifted.

17. The integrated circuit as recited in claim 15 wherein the level shifter circuit comprises an output inverter comprising a series connection of two n-type metal oxide semiconductor (NMOS) transistors, wherein a gate of a first of the NMOS transistors is coupled to receive the level-shifted signal, and wherein a gate of a second of the NMOS transistors is coupled to the first supply voltage.

18. The integrated circuit as recited in claim 17 wherein the output inverter further comprises a series connection of two p-type metal oxide semiconductor (PMOS) transistors, wherein a gate of a first of the PMOS transistors is coupled to receive the level-shifted signal, and wherein a gate of a second of the PMOS transistors is coupled to the first supply voltage, and wherein a source of the second of the PMOS transistors is coupled to the second supply voltage.

* * * * *